(12) United States Patent
Miura (10) Patent No.: US 9,153,683 B2
(45) Date of Patent: Oct. 6, 2015

(54) SEMICONDUCTOR DEVICE (71) Applicant: Renesas Electronics Corporation, Kawasaki-shi, Kanagawa (JP)

(72) Inventor: Yoshinao Miura, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/038,327

(22) Filed: Sep. 26, 2013

(65) Prior Publication Data
US 2014/0097445 A1    Apr. 10, 2014

(30) Foreign Application Priority Data

Oct. 5, 2012 (JP) .................... 2012-222724

(51) Int. Cl.
*H01L 29/778* (2006.01)
*H01L 29/417* (2006.01)
*H01L 29/872* (2006.01)
*H01L 29/78* (2006.01)
*H01L 29/20* (2006.01)

(52) U.S. Cl.
CPC ........ *H01L 29/778* (2013.01); *H01L 29/41758* (2013.01); *H01L 29/7787* (2013.01); *H01L 29/872* (2013.01); *H01L 29/2003* (2013.01); *H01L 29/7783* (2013.01); *H01L 29/78* (2013.01)

(58) Field of Classification Search
CPC .... H01L 29/778; H01L 29/78; H01L 29/7783
See application file for complete search history.

(56) References Cited

U.S. PATENT DOCUMENTS

| 7,737,467 | B2 | 6/2010 | Saito et al. | |
| 2001/0015437 | A1 | 8/2001 | Ishii et al. | |
| 2008/0054304 | A1* | 3/2008 | Sadaka et al. | 257/194 |
| 2008/0230807 | A1* | 9/2008 | Kuroda et al. | 257/197 |
| 2008/0315257 | A1* | 12/2008 | Shiraishi | 257/195 |
| 2011/0233615 | A1* | 9/2011 | Machida | 257/195 |

FOREIGN PATENT DOCUMENTS

| JP | 2001-210657 A | 8/2001 |
| JP | 2007-059589 A | 3/2007 |

* cited by examiner

*Primary Examiner* — Peniel M Gumedzoe
(74) *Attorney, Agent, or Firm* — Miles & Stockbridge P.C.

(57) ABSTRACT

A transistor SEL is formed by using a compound semiconductor layer (channel layer CNL). The channel layer CNL is formed over a buffer layer BUF. In a first direction where a drain electrode DRE, a gate electrode GE, and a source electrode SOE of the transistor SEL are arranged, at least a portion of the buried electrode BE is situated on the side opposing the source electrode SOE with reference to the gate electrode GE. The buried electrode BE is connected to the source electrode SOE of the transistor SEL. The top end of the buried electrode BE intrudes into the buffer layer BUF.

13 Claims, 10 Drawing Sheets

SEMICONDUCTOR DEVICE

CROSS-REFERENCE TO RELATED APPLICATIONS

The disclosure of Japanese Patent Application No. 2012-222724 filed on Oct. 5, 2012 including the specification, drawings, and abstract is incorporated herein by reference in its entirety.

BACKGROUND

The present invention relates to a semiconductor device and concerns a technique applicable to a semiconductor device having a transistor formed in a compound semiconductor layer.

Since compound semiconductors such as GaN have a band gap larger than that of silicon and have a larger critical electric field, they can easily form high voltage transistors with low loss. However, it is difficult to obtain p-type compound semiconductors. Accordingly, it is difficult to form p/n junction diodes as protective devices for the transistors.

As a countermeasure, Japanese Unexamined Patent Publication No. 2007-59589 describes that a Schottky barrier diode is used as a protective device for a transistor. In Japanese Unexamined Patent Publication No. 2007-59589, a Schottky electrode is formed over the surface of a GaN layer in the Schottky junction of the Schottky barrier diode.

Japanese Unexamined Patent Publication No. 2001-210657 describes that a depletion type transistor and an enhancement type transistor are arranged over one identical substrate. In Japanese Unexamined Patent Publication No. 2001-210657, a substrate has a structure comprising a p-type GaN layer, a n-type GaN layer, and an AlGaN layer stacked in this order. Then, in the n-type GaN layer and, the AlGaN layer, an acceptor (p-type impurity) is introduced into a region situated below the gate electrode of the enhancement type transistor.

SUMMARY

As a result of investigation made by the present inventors, it has been found that an electric field tends to be concentrated to a region at the edge of the lower surface of the Schottky electrode opposing the gate electrode, in the structure described in Japanese Unexamined Patent Publication No. 2007-59589. In this case, when a voltage is applied to the Schottky barrier diode and the Schottky barrier diode starts to operate as a protective device, a current tends to concentrate to a region of the semiconductor layer that forms the Schottky junction opposing the gate electrode. In this case, temperature increases at the portion where the current concentrates to result in a possibility that the Schottky barrier diode suffers from damage. Other subjects and novel features will become apparent in view of the description of the present specification and the accompanying drawings.

According to an embodiment of the invention, a transistor is formed by using a compound semiconductor layer. The compound semiconductor layer is formed over a buffer layer. In a first direction where a drain, a gate electrode, and a source of the transistor are arranged, at least a portion of a buried electrode is situated on the side opposing the source with reference to the gate electrode. The buried electrode is connected by way of a connection member to the source of the transistor. Then, the top end of the buried electrode intrudes into the buffer layer.

According to the embodiment described above, the Schottky barrier diode can be suppressed from undergoing damages during operation as a protective device.

DETAILED DESCRIPTION

Preferred embodiments of the present invention are to be described with reference to the drawings. Throughout the drawings, identical constituent elements carry same reference numerals for which duplicate operation is to be omitted optionally.

First Embodiment

Figure 1:
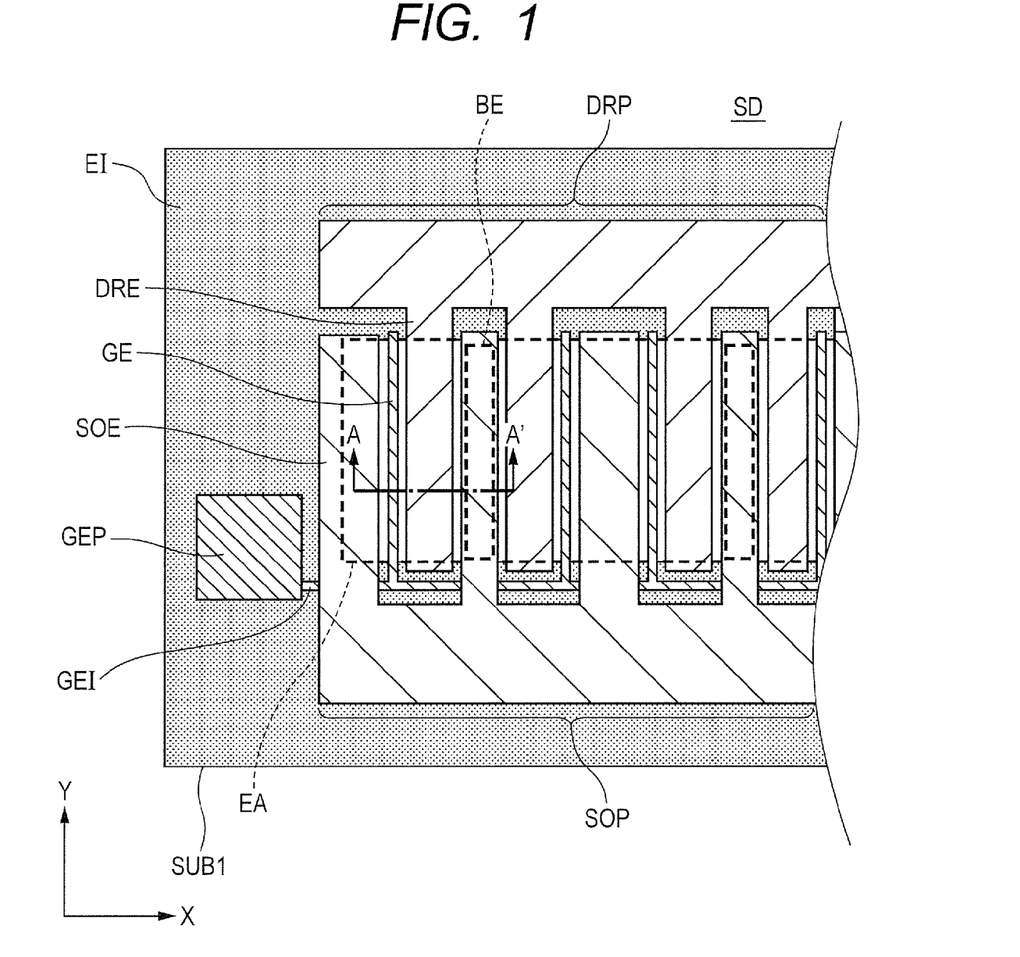
FIG. 1 is a plan view illustrating a configuration of a semiconductor device according to a first embodiment.
Figure 2:
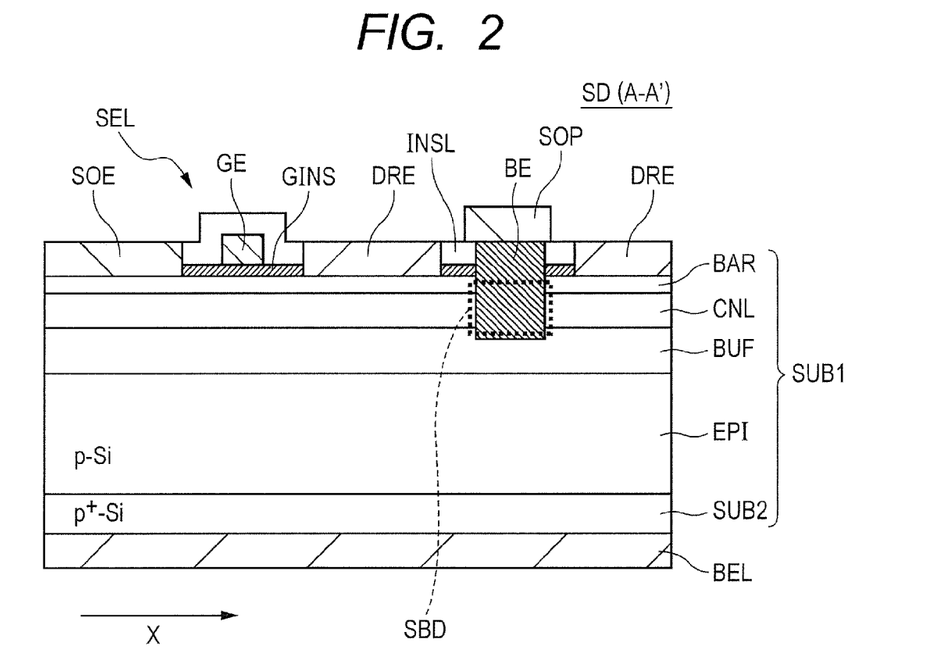
FIG. 2 is a cross sectional view along line A-A' in FIG. 1.
Figure 3:
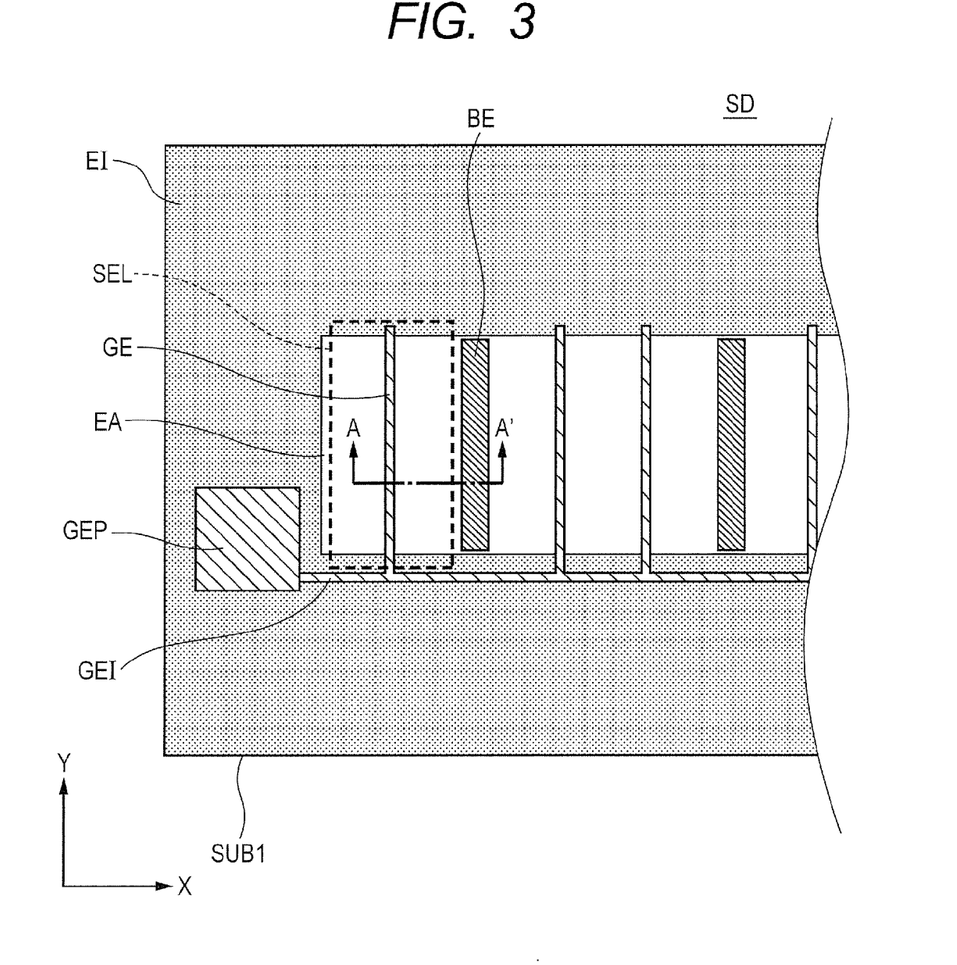
FIG. 3 is a view in which a drain electrode, a drain pad, a source electrode, and a source pad are removed from FIG. 1.

FIG. 1 is a plan view illustrating a configuration of a semiconductor device SD according to a first embodiment. FIG. 2 is a cross sectional view along line A-A' in FIG. 1. FIG. 3 is a view in which a drain electrode DRE, a drain pad DRP, a source electrode SOE and a source pad SOP are removed from FIG. 1. As illustrated in FIG. 2, a semiconductor device SD has a substrate SUB1, a transistor SEL, and a buried electrode BE.

As illustrated in FIG. 2, the substrate SUB1 has a first conduction type epitaxial silicon layer BP1 (base layer), a buffer layer BUF, and a channel layer CNL (compound semiconductor layer). The transistor SEL is formed in the substrate SUB1. Specifically, the channel of the transistor SEL is formed in the channel layer CNL. Further, the transistor SEL has a drain electrode DRE, a gate electrode GE, and a source electrode SOE (source). A buried electrode BE is buried in the channel layer CNL and intrudes at the top end into the buffer layer BUF. In a first direction where the drain electrode DRE, the gate electrode BE, and the source electrode SOE are arranged (direction X in the drawing), at least a portion of the buried electrode BE is disposed on the side opposing the source electrode SOE with reference to the gate electrode GE. Further, the buried electrode BE is electrically connected by way of a source pad SOP (connection member) to the source electrode SOE.

In the configuration described above, since a boundary between the buried electrode BE and the channel layer CNL forms a Schottky junction, the portion operates as a Schottky barrier diode SBD. Further, the buried electrode BE of the Schottky barrier diode SBD is electrically connected to the source electrode SOE. Also, the channel layer CNL is electrically connected to the drain electrode DRE. The Schottky barrier diode SBD therefore operates as a protective device of transistors SEL.

Further, the top end of the buried electrode BE is buried in the buffer layer BUF. Therefore, the Schottky junction forming the Schottky barrier diode SBD is formed on the lateral side of the buried electrode BE. Accordingly, an electric field can be suppressed from concentrating to a specified portion of the buried electrode BE in the Schottky junction forming region. Accordingly, damages to the Schottky barrier diode SBD due to localization of a current to the specified portion of the Schottky barrier diode SBD can be suppressed during operation of the Schottky barrier diode SBD as a protective device.

The configuration of the semiconductor device SD is to be described specifically assuming the first conduction type as a p-type and a second conduction type as an n-type. Alternatively, the first conduction type may be an n-type and the second conduction type may be a p-type. Further, in FIG. 1 and FIG. 3, an interlayer insulation film INSL, etc. are not shown for the simplicity of explanation.

At first, a planar layout of the semiconductor device SD is to be described with reference to FIG. 3. A device isolation region EI is formed in the substrate SUB1. The device isolation region EI isolates device forming regions EA from other region. The device isolation region EI is a region in which an impurity (for example, B) at high concentration is introduced, for example, into a barrier layer BAR (details are to be described later with reference to FIG. 2) and the channel layer CNL to increase resistance. The lower end of the device isolation region EI is situated to the surface layer of the buffer layer BUF. A plurality of transistors SEL are formed in the device forming region EA.

The transistors SEL are arranged in a first direction (direction X). Each of the transistors SEL has a gate electrode GE. The gate electrodes GE extend parallel to each other in a second direction (direction Y). Specifically, the device forming region EA has a rectangular shape. The gate electrode GE extends parallel to the shorter side of the device forming region EA. The gate electrode GE is formed, for example, of a metal containing Au or Al.

Both ends of the gate electrode GE are situated over the device isolation region EI. Then, one end of the gate electrode GE is connected by way of a gate interconnect GEI to a gate pad GEP. The gate interconnect GEI is formed over the device isolation EI and extends in the first direction (direction X). That is, the gate electrode GE has a comb-shape.

The buried electrode BE is disposed in a region between the gate electrodes GE in the device forming region EA. Specifically, in the region between the gate electrodes GE of the device forming region EA, a region provided with the buried electrode BE and a region not provided with the buried electrode BE are situated alternately. In the region between the gate electrodes GE, the region provided with the buried electrode BE serves as the drain of the transistor SEL. Further, in the region between the gate electrodes GE, the region not provide with the buried electrode serves as the source of the transistor SEL.

Although not illustrated in FIG. 3, a source electrode SOE and a drain electrode DRE are formed over the substrate SUB1. The source electrode SOE is situated in the device forming region EA over a region that serves as a source and the drain electrode DRE is situated in the device forming region EA that serves as a drain.

Then, a planar layout of the source electrode SOE and the drain electrode DRE is to be described with reference to FIG. 1. In this embodiment, the source electrode SOE, the gate electrode GE, the drain electrode DRE, the buried electrode BE, the drain electrode DRE, and the gate electrode GE are arranged in this order repetitively in the first direction (direction X) in the device forming region EA. That is, a plurality of the transistors SEL are arranged side by side in the first direction. Two adjacent transistors SEL are in opposite directions. The buried electrode BE is situated between the drains of the two adjacent transistors. With such a configuration, the number of buried electrodes BE can be decreased to reduce the size of the semiconductor device SD.

Then, a plurality of the source electrodes SOE are connected parallel to each other by way of the source pad SOP and a plurality of the drain electrodes DRE are connected to each other by way of the drain pad. DRP. Both the source pad SOP and the drain electrode DRE overlap with the device isolation region EI in a plan view. A portion of the source pad SOP extends over the buried electrode BE and connected to the buried electrode BE in a plan view.

Since the source pad SOP is integrated with the source electrode SOE, it can be said that the source pad SOP is a portion of the source electrode SOE. In the same manner, since the drain pad DRP is integrated with the drain electrode DRE, it can be said that the drain pad DRP is a portion of the drain electrode DRE. That is, in this embodiment, each of the source electrode SOE and the drain electrode DRE has a comb-teeth shape. The source electrode SOE and the drain electrode DRE are formed, for example, of Al or Al alloy.

Then, a cross sectional structure of the semiconductor device SD is to be described with reference to FIG. 2. The substrate SUB1 has a configuration comprises an epitaxial silicon layer EPI, a buffer layer BUF, a channel layer CNL, and a barrier layer BAR epitaxially grown in this order above the substrate SUB2. The substrate SUB1 is, for example, a $p^+$-type bulk silicon substrate. The epitaxial silicon layer EPI is a p-type epitaxial layer and formed over the substrate SUB2. The buffer layer BUF is a buffer between the channel layer CNL and the epitaxial silicon layer EPI. The buffer layer BUF comprises, for example, a nitride semiconductor layer in which an AlN layer and a GaN layer are stacked repetitively. The channel layer CNL is a layer epitaxially grown over a buffer layer BUF. The channel layer CNL comprises, for example, GaN but it may also be other nitride semiconductor layer comprising, for example, AlGaN. That is, the channel layer CNL is a layer having Ga and N. A barrier layer BAR is formed of a material having a lattice constant different from that of the channel layer CNL. The barrier layer BAR comprises, for example, AlGaN. When the barrier layer BAR is formed, a two-dimensional electron gas is generated as carriers in the channel layer CNL.

In this embodiment, the transistor SEL is a normally on type transistor in which a two-dimensional electron gas is formed as carriers in the channel layer CNL. However, the transistor SEL may also be a normally off type transistor as in modified embodiments to be described later.

The device isolation region EI is buried in the barrier layer BAR, the channel layer CNL, and the buffer layer BUF. Specifically, the device isolation region EI penetrates the barrier layer BAR and the channel layer CNL, and is situated at the lower surface in the buffer layer BUF.

As described above, the lower end of the buried electrode BE intrudes into the buffer layer BUF. The depth of the region of the buried electrode BE that intrudes into the buffer layer BUF is, for example, 100 nm or more. However, the depth may be less than 100 nm and, for example, it may suffice that the lower end penetrates the ALN layer at the uppermost layer. With such a configuration, localization of the electric field to the lower end of the buried electrode BE can be suppressed sufficiently. The upper surface of the buried electrode BE is coplanar with the upper surface of the interlayer insulation film INSL.

Further, in the direction X in the drawing (first direction), the distance from the buried electrode BE to the drain electrode DRE is shorter than the distance from the drain electrode DRE to the gate electrode GE. With such a configuration, an electric field between the buried electrode BE and the drain electrode DRE increases to such an extent as causing avalanche breakdown before the electric field between the drain electrode DRE and the gate electrode GE increases to such an extent as causing avalanche breakdown. Accordingly, the Schottky barrier diode SBD operate easily as a protective device for the transistor SEL. In this embodiment, the drain electrode DRE is situated between the buried electrode BE and the gate electrode GE.

The buried electrode BE is formed, for example, of a semiconductor (for example, polysilicon) introduced with an impurity. With such a configuration, connection between the buried electrode BE and the channel layer CNL tends to form a Schottky junction. In this embodiment, a p-type impurity is used as the impurity. The buried electrode BE may also be formed of a metal so long as the connection between the buried electrode BE and the channel layer CNL forms a Schottky junction.

Then, a gate insulation film GINS is formed to a region over the barrier layer BAR where the gate electrode GE is formed. The gate insulation film GINS comprises, for example, $Al_2O_3$ or $SiO_2$ in an amorphous state. The gate insulation film GINS is formed also over the device isolation region EI. The gate interconnect GEI is formed over the gate insulation film GINS situated over the device isolation region EI.

The interlayer insulation film INSL is formed over the gate insulation film GINS and over the gate electrode GE. The interlayer insulation film INSL is formed, for example, of a SiN film. Further, the source pad SOP and the drain pad DRP are formed over the interlayer insulation film INSL. Then, the upper end of the buried electrode BE is exposed over the interlayer insulation film INSL and is connected at the exposed portion with the source pad SOP.

A back electrode BEL is formed at the back of the substrate SUB2. The back electrode BEL is formed, for example, of a stacked Au/Ti film. A reference potential, for example, a potential equal with that for the source pad SOP is applied on the back electrode BEL.

Figure 4:
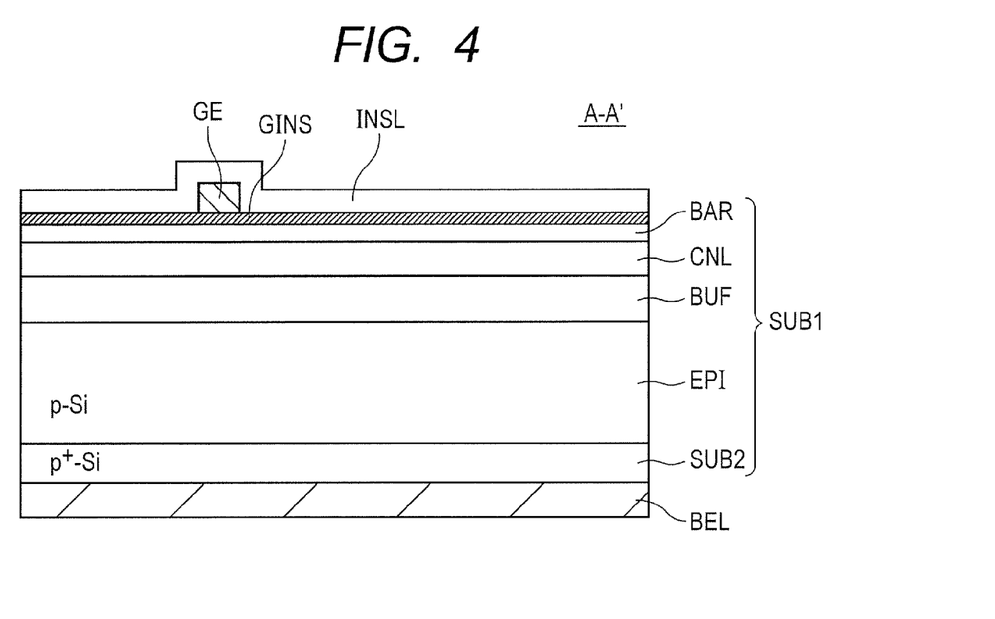
FIG. 4 is a cross sectional view illustrating a method of manufacturing the semiconductor device illustrated in FIG. 1 to FIG. 3.
Figure 5:
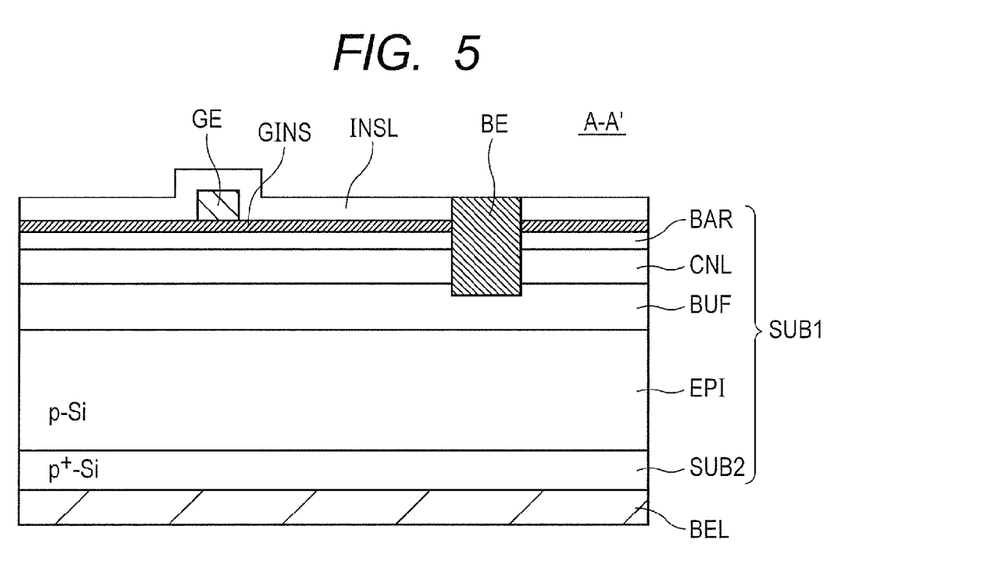
FIG. 5 is a cross sectional view illustrating a method of manufacturing the semiconductor device illustrated in FIG. 1 to FIG. 3.

FIG. 4 and FIG. 5 are cross sectional views illustrating a method of manufacturing the semiconductor device illustrated in FIG. 1 to FIG. 3. At first, as illustrated in FIG. 4, an epitaxial silicon layer EPI, a buffer layer BUF, a channel layer CNL, and a barrier layer BAR are epitaxially grown in this order above a substrate SUB2. Then, the device isolation region EI is formed in the barrier layer BAR and the channel layer CNL.

Then, a gate insulation film GINS is formed over the barrier layer BAR and the device isolation region EI by using, for example, a CVD method. Then, conductive films to form a gate electrode GE, a gate interconnect GEI, and a gate pad DEP are formed over the gate insulation film GINS by a sputtering method. Then, the conductive films are removed selectively, for example, by etching using a resist pattern. Thus, the gate electrode GE, the gate interconnect GEI, and the gate pad GEP are formed. Then, an interlayer insulation film INSL is formed over the gate electrode GE and over the gate insulation film GINS by a CVD method.

Then, as illustrated in FIG. 5, a mask pattern (not illustrated) is formed over the interlayer insulation film INSL, and the gate insulation film GINS, the channel layer CNL, and the buffer layer BUF are etched using the mask pattern as a mask. Thus, trench for burying the buried electrode BE is formed. The top end (bottom) of the trench intrudes into the buffer layer BUF. Then, the mask pattern is removed.

Then, a conductive film to form the buried electrode BE is embedded in the trench and over the interlayer insulation film INSL. Then, the conductive film is etched back. Thus, the buried electrode BUF is formed.

Subsequently, a portion of the interlayer insulation film INSL situated over the device forming region BA that is situated over the region in which a source electrode SOE and a drain electrode DRE are to be formed. A metal film to form the source electrode SOE and the drain electrode DRE is formed over the interlayer insulation film INSL, over the buried electrode BE, and over the barrier layer BAR situated in the device forming region EA, for example, by a sputtering method. Then, the metal film is removed selectively. Thus, the source electrode SOE, the source pad SOP, the drain electrode DRE, and the drain pad DRP are formed. Further, a back electrode BEL is formed at the back of the substrate SUB2.

According to this embodiment, the lateral side of the buried electrode BE is in contact with the channel layer CNL and the boundary between them forms a Schottky junction. Accordingly, the portion operates as a Schottky barrier diode SBD. Then, the buried electrode BE of the Schottky barrier diode SED is electrically connected to the source electrode SOE. Further, the channel layer CNL is electrically connected with the drain electrode DRE. Accordingly, the Schottky barrier diode SBD operates as a protective device for the transistor SEL.

Further, the top end of the buried electrode BE intrudes into the buffer layer BUF. Accordingly, localization of the electric field to a specified portion in the region of the buried electrode BE that forms the Schottky junction can be suppressed. Accordingly, damages to the Schottky barrier diode SED by localization of an electric current to a specified portion of the Schottky barrier diode SBD can be suppressed during operation of the Schottky barrier diode SBD as the protective device.

The structure of the transistor SEL is not restricted to the structure described above.

Figure 6:
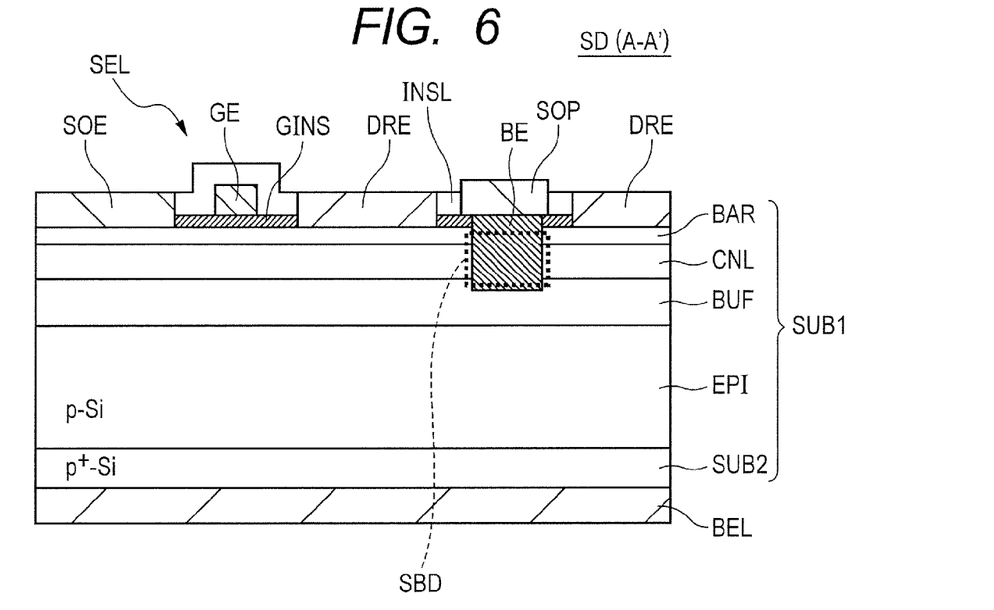
FIG. 6 is a view illustrating a first modified embodiment in FIG. 2 along cross section.

FIG. 6 is a view illustrating a first modified embodiment in FIG. 2 along a cross section A-A'. The embodiment illustrated in the drawing is identical with the embodiment illustrated in FIG. 2 except that the upper surface of the buried electrode BE is coplanar with the upper surface of the gate insulation film GINS. Such a configuration can be achieved by performing a step of forming the buried electrode BL after forming the gate insulation film GINS and before forming the interlayer insulation film INSL.

Figure 7:
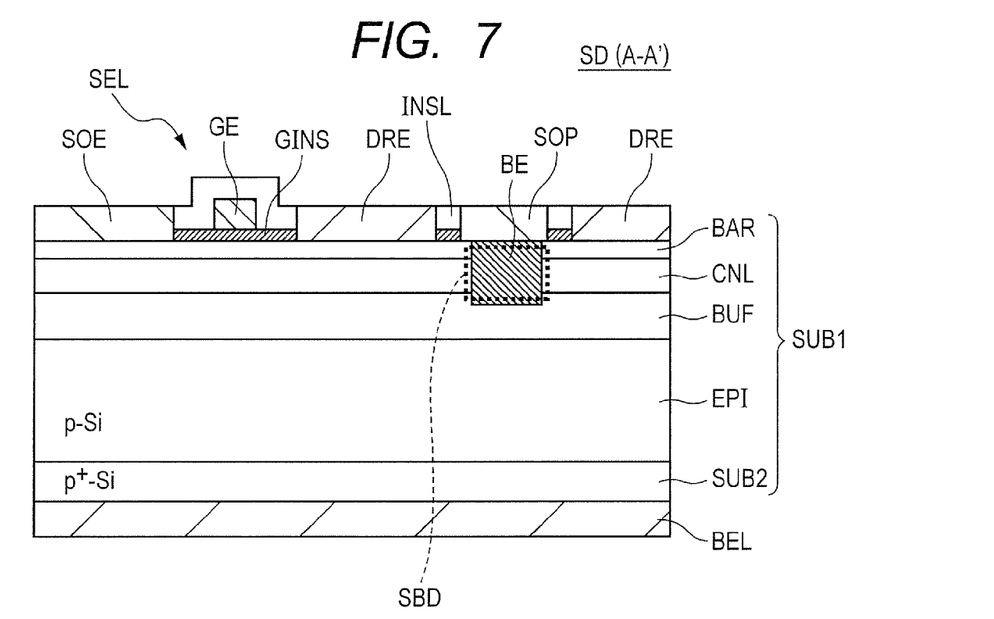
FIG. 7 is a view illustrating a second modified embodiment in FIG. 2 along cross section.

FIG. 7 is a view illustrating a second modified embodiment in FIG. 2 along a cross section A-A'. The example illustrated in the drawing is identical with that illustrated in FIG. 2 except that the upper surface of the buried electrode BE is coplanar with the upper surface of the barrier layer BAR. Such a configuration can be achieved by performing a step of forming the buried electrode BE after forming the barrier layer BAR and before forming the gate insulation film GINS.

Figure 8:
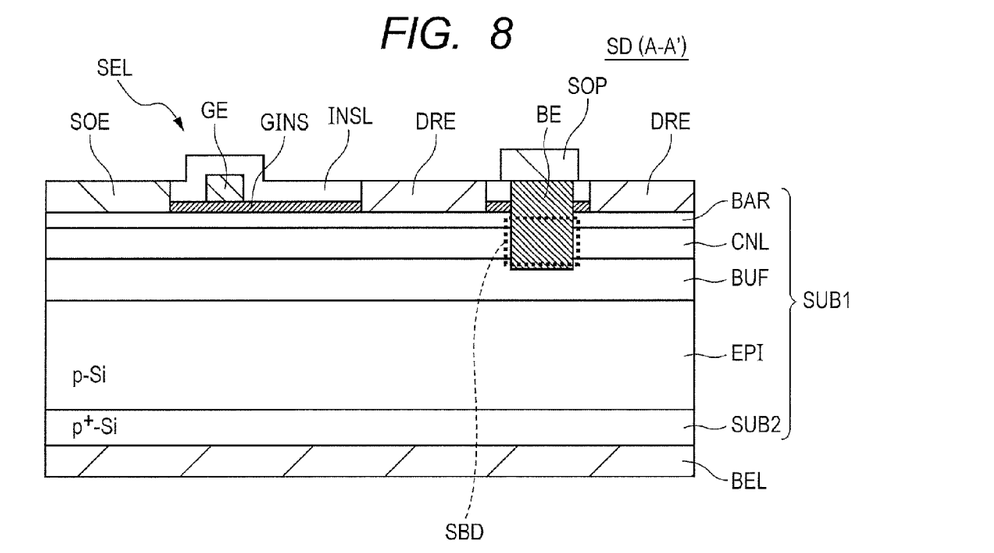
FIG. 8 is a view illustrating a third modified embodiment in FIG. 2 along A-A' cross section.

FIG. 8 is a view illustrating a third modified embodiment in FIG. 2. The example illustrated in the drawing is identical with the first embodiment illustrated in FIG. 2 except that the distance from the gate electrode GE to the drain electrode DRE is longer than the distance from the gate electrode GE to the source electrode SOE. According to the embodiment illustrated in the drawing, withstanding voltage between the gate electrode GE and the drain electrode DRE can be increased.

Figure 9:
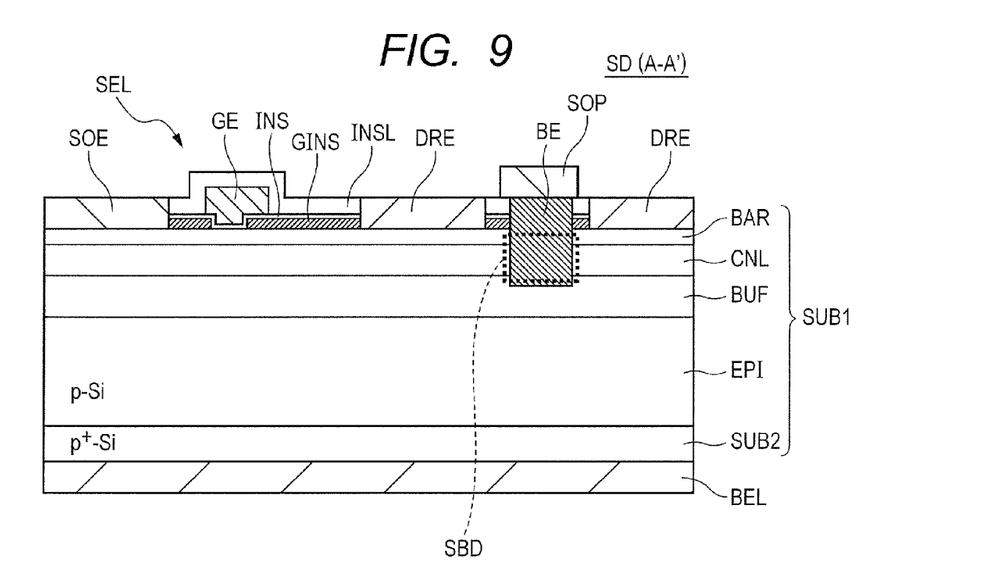
FIG. 9 is a view illustrating a fourth modified embodiment in FIG. 2 along A-A' cross section.

FIG. 9 is a view illustrating a fourth modified embodiment in FIG. 2 along cross section A-A'. In the embodiment illustrated in the drawing, the transistor SEL is a MIS-HJ-FET (Metal-Insulator-Semiconductor Hetero-Junction Field-Effect Transistor). Specifically, an insulation film INS is formed over a barrier layer BAR. The insulation film INS comprises, for example, an SiN film. Then, a portion of the gate electrode GE and the gate insulation film GINS is buried in the insulation film INS. The gate electrode GE is connected with the barrier layer BAR by way of a gate insulation film GINS. The gate insulation film GINS is formed also over the insulation film INS.

In this embodiment, a two-dimensional electron gas, formed in the channel layer CNL is disconnected at a portion situated below the gate electrode GE. Therefore, a current does not flow in the channel layer CNL in a state where the voltage is not applied on the gate electrode GE. Then, when the voltage is applied on the gate electrode GE, a current flows in the channel layer CNL. That is, the transistor SEL is a normally off type.

Figure 10:
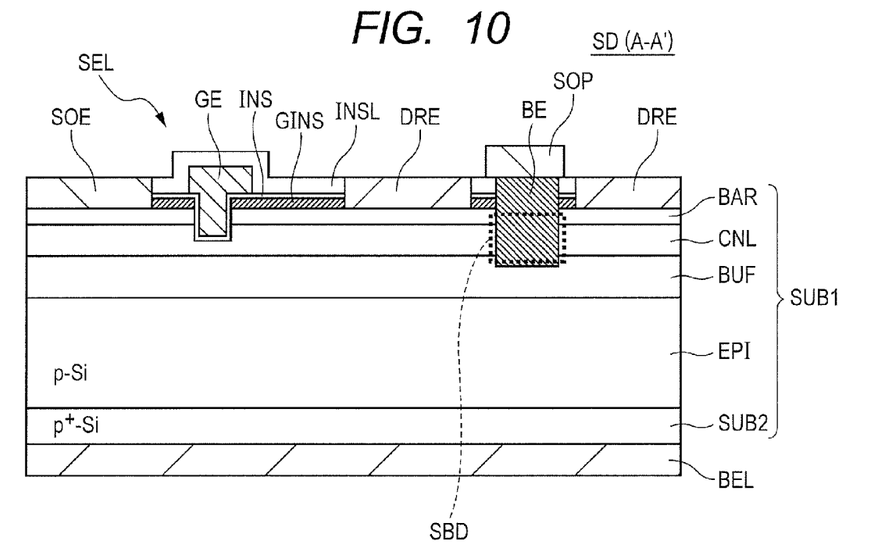
FIG. 10 is a view illustrating a fifth modified embodiment in FIG. 2 along A-A' cross section.

FIG. 10 is a view illustrating a fifth modified embodiment in FIG. 2 along a cross section A-A'. In the embodiment illustrated in the drawing, a transistor, SEL is a MIS-FET (Metal-Insulator-Semiconductor Field-Effect transistor), which is a normally off type transistor. Specifically, the embodiment illustrated in the drawing is identical with the embodiment illustrated in FIG. 9 except that a portion of the gate electrode GE and the interlayer insulation film INSL intrude into the channel layer CNL.

In this embodiment, a two-dimensional electron gas formed in the channel layer CNL is disconnected by the gate electrode GE. Accordingly, a current does not flow in the channel layer CNL in a state where a voltage is not applied on the gate electrode GE. Then, when a voltage is applied on the gate electrode GE, a current flows in the channel layer CNL.

Figure 11:
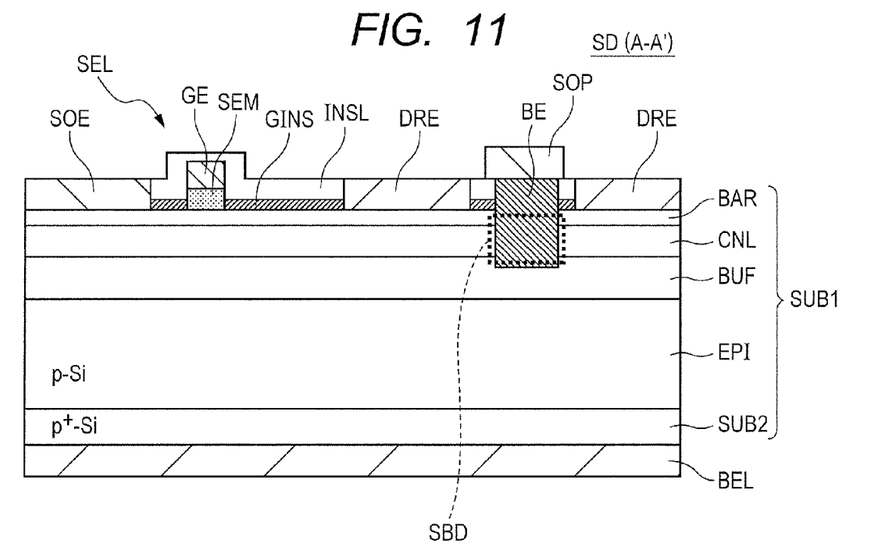
FIG. 11 is a view illustrating a sixth modified embodiment in FIG. 2 along A-A' cross section.

FIG. 11 is a view illustrating a sixth modified embodiment in FIG. 2 along a cross section A-A'. In the embodiment illustrated in the drawing, a transistor SEL is a J-FET (Junction Field-Effect Transistor), which is a normally off type transistor. Specifically, a first conduction type layer SEM is formed between a barrier layer BAR and a gate electrode GE. The first conduction type layer SEM comprises, for example, AlGaN.

Second Embodiment

Figure 12:
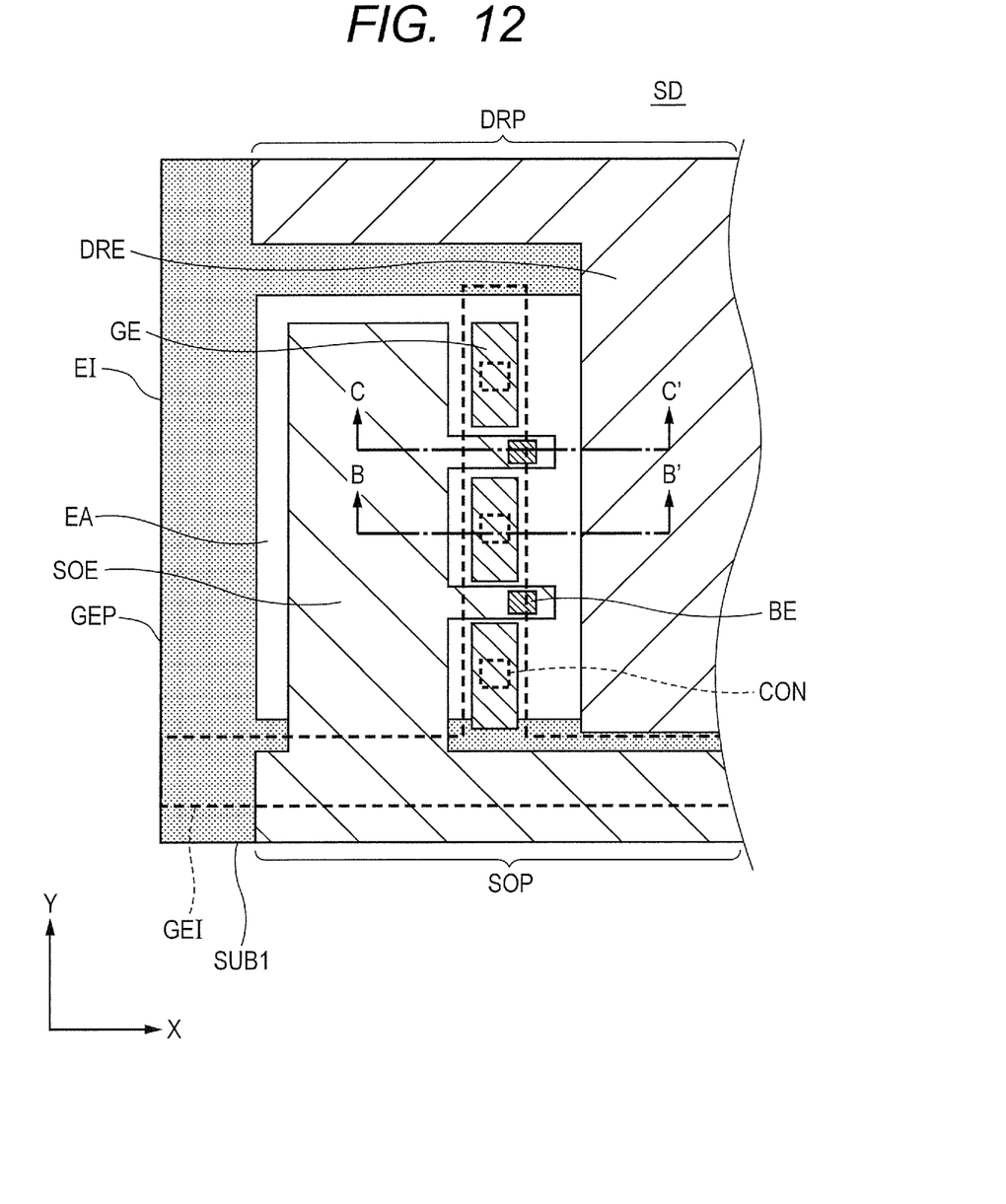
FIG. 12 is a plan view illustrating a configuration of a semiconductor device according to a second embodiment.

FIG. 12 is a plan view illustrating a configuration of a semiconductor device SD according to a second embodiment. The semiconductor device SD according to this embodiment has the same configuration as that of the semiconductor device SD according to the first embodiment except for the followings.

At first, in a first direction (direction X in the drawing), a buried electrode BE is situated between a gate electrode GE and a drain electrode DRE. Also in this embodiment, since the distance from the buried electrode BE to the drain electrode DRE is shorter than the distance from the drain electrode DRE to the gate electrode GE, the same effect as that in the first embodiment can be obtained.

Further, in the embodiment illustrated in the drawing, the gate electrode GE is divided into plurality in a second direction (direction Y in the drawing). A voltage is applied by way of a contact CON to each of the divided gate electrodes GE. In the second direction, the buried electrode BE is situated between a plurality of gate electrodes GE and partially overlaps with the gate electrode GE in the first direction. Therefore, increase in the size of the transistor SEL in the first direction (direction X in the drawing) can be suppressed.

Further, a portion of the source electrode SOE that overlaps with a portion between the gate electrodes GE in the second direction (direction Y in the drawing) extends in the first direction (direction X in the drawing) and is connected with the buried electrode BE.

Figure 13:
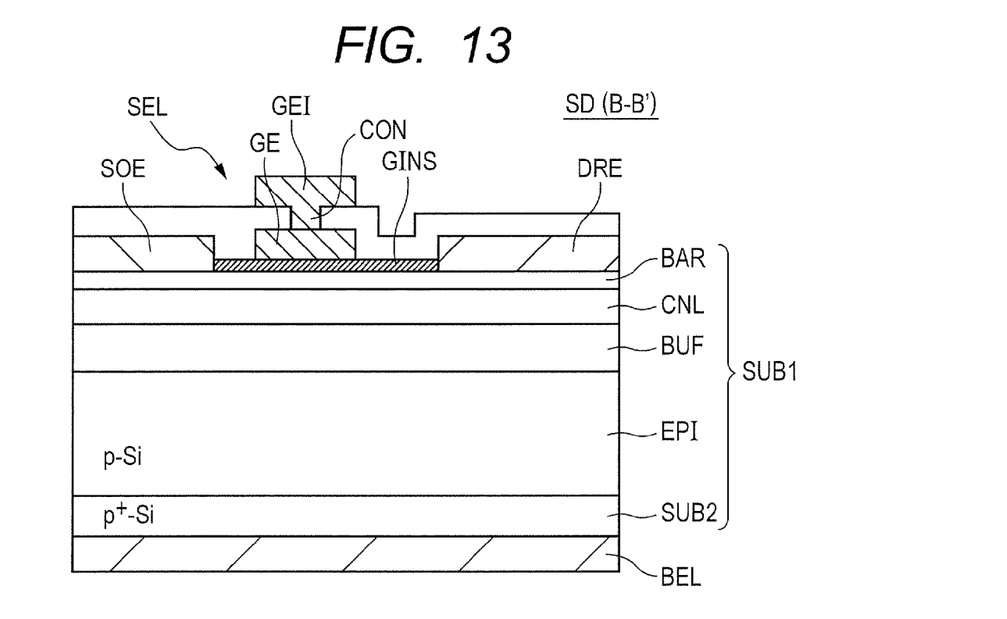
FIG. 13 is a view illustrating a cross section along line B-B' in FIG. 12.

FIG. 13 is a drawing illustrating a cross section B-B' in FIG. 12. In this embodiment, a gate interconnect GEI is formed over an interlayer insulation film INSL, and a source pad SOP and a drain pad DRP are formed on a device isolation region EI. Then, the gate interconnect GEI is connected by way of a contact CON buried in the interlayer insulation film INSL to each of the plurality of gate electrodes GE.

Figure 14:
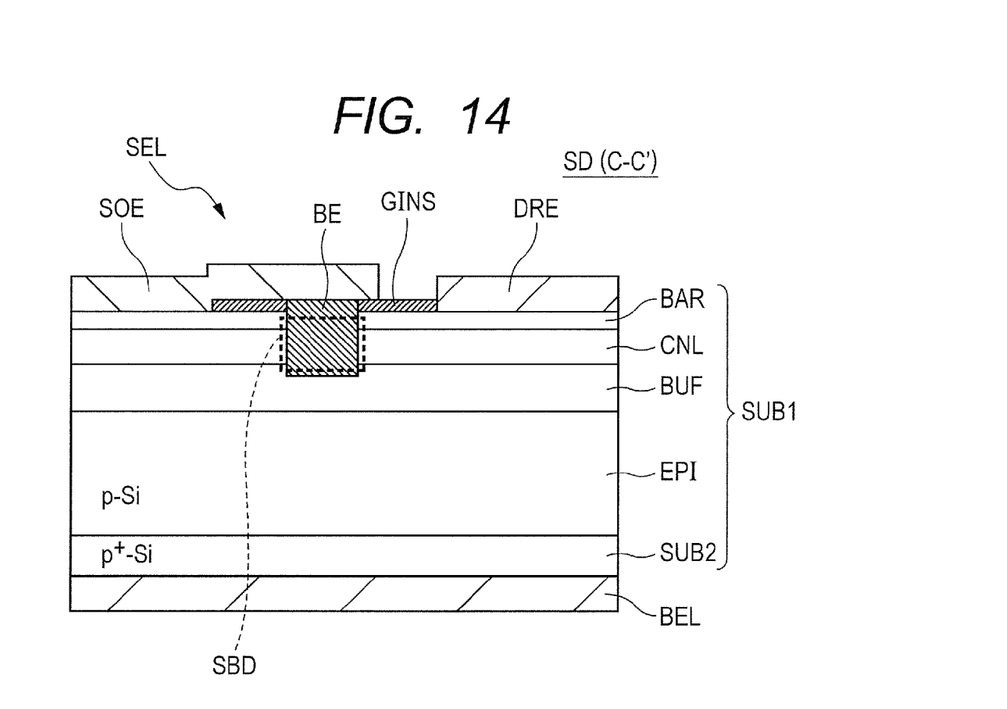
FIG. 14 is a view illustrating a cross section along line C-C' in FIG. 12.

FIG. 14 is a drawing illustrating a cross section C-C' in FIG. 12. As described above, a portion of the source electrode SOE that overlaps with a portion between the gate electrodes GE in the second direction (direction Y in the drawing) extends in the first direction (direction X in the drawing) and is connected with the buried electrode BE. Specifically, the upper surface of the buried electrode BE is coplanar with the upper surface of the gate insulation film GINS. A portion of the source electrode SOE that extends in the first direction is situated over the gate insulation film GINS. A portion of the source electrode SOE that is situated over the gate insulation film GINS is connected with the buried electrode BE.

A method of manufacturing the semiconductor device SD according to this embodiment is identical with the method of manufacturing the semiconductor device SD illustrated in FIG. 6 for the first embodiment except that an interlayer insulation film INSL is formed after forming a source electrode SOE and a drain electrode DRE and that a gate interconnect GEI and a contact CON are formed after forming the interlayer insulation film INSL.

Also in this embodiment, the same effect as that of the first embodiment can be obtained. Further, the buried electrode BE partially overlaps with the gate electrode GE in the first direction (direction X in the drawing). Accordingly, increase in the size of the transistor SEL in the first direction (direction X in the drawing) can be suppressed.

Third Embodiment

Figure 15:
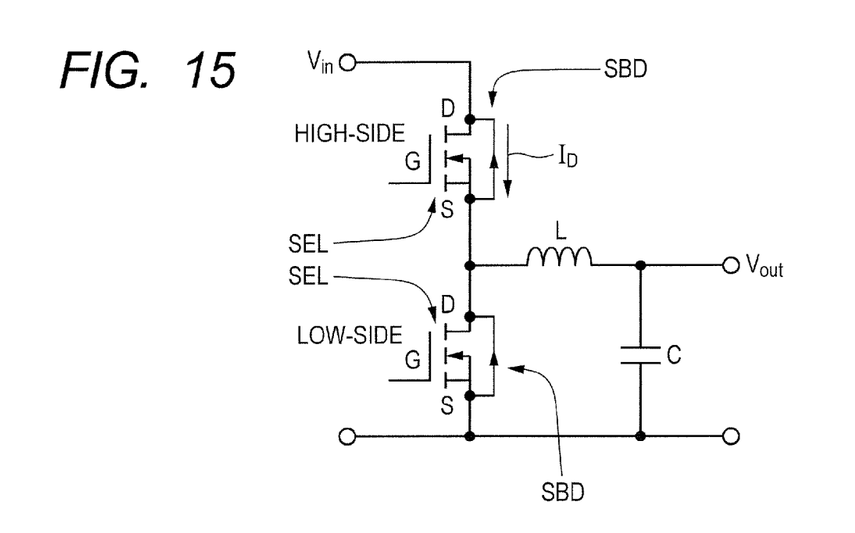
FIG. 15 is a circuit diagram of a circuit of a semiconductor device according to a third embodiment.

FIG. 15 illustrates a circuit diagram of a circuit of the semiconductor device SD according to the third embodiment. The circuit illustrated in the drawing is a DC/DC converter in which a first transistor SEL and a second transistor SEL are connected in series. A Schottky barrier diode SBD is connected in parallel to each of the two transistors SEL. The output terminal of the DC/DC converter is connected to a connection portion of the first transistor SEL and the second transistor SEL. Further, a capacitance device C is connected between the output terminal and the ground terminal of the DC/DC converter. The configuration of the transistor SEL and that of the Schottky barrier diode SBD are identical with those of the first embodiment or the second embodiment.

Figure 16A:
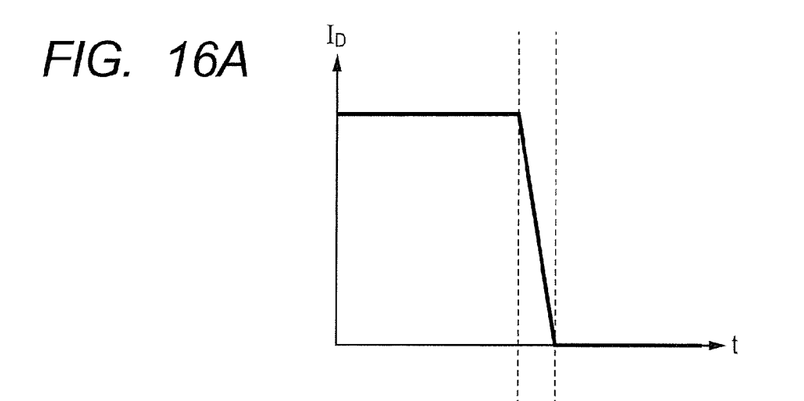
FIGS. 16A and 16B are views for explaining the operation of a Schottky barrier diode illustrated in FIG. 15.
Figure 16B:
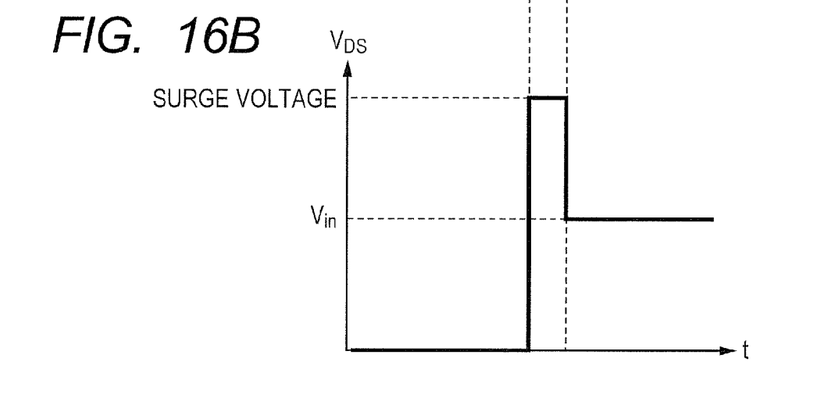

FIG. 16 is a graph for explaining the operation of the Schottky barrier diode SBD illustrated in FIG. 15. FIG. 16A shows change of a current flowing through the first transistor SEL while FIG. 16B shows the change of a drain voltage ($V_{DS}$) of the first transistor SEL.

In the circuit illustrated in FIG. 15, a first transistor SEL (High-side) and a second transistor SEL (Low-side) are alternately turned on and off by a high frequency wave. Then, a DC input voltage Vin is converted into a DC output voltage Vout in accordance with an on time ratio of the two transistors SEL.

It is considered herein an instance at which the first transistor SEL (High-side) turns from an on state to an off state. A surge voltage supposes on $V_{DS}$ by the effect of a floating inductance L of the transistor SEL. When the surge voltage is sufficiently high, the Schottky barrier diode SBD operates before generation of avalanche breakdown in the first transistor SEL. Therefore, the first transistor SEL can be protected by the Schottky barrier diode SBD. Such a situation tends to occur when an on-current is extremely large, for example, upon actuation of the DC/DC converter.

On the other hand, when a negative bias is applied on the drain side of the first transistor SEL, a current flows in the forward direction of the Schottky barrier diode. In this case, the negative bias is applied also on the drain side of the second transistor SEL and, as a result, a current flows in the forward direction also in the Schottky barrier diode SBD connected in parallel with the second transistor SEL (Low-side).

As described above according to this embodiment, the DC/DC converter can be manufactured by using the compound semiconductor.

While the invention made by the present inventors has been described specifically based on the preferred embodiments, the invention is not restricted to the embodiments but can be modified variously within a range not departing the gist of the invention.

What is claimed is:

1. A semiconductor device comprising:
a substrate having a base layer, a buffer layer formed over the base layer, and a compound semiconductor layer formed over the buffer layer,
a first transistor with a channel being formed in the compound semiconductor layer and having a drain, a gate electrode, and a source, the drain, the gate electrode, and the source being arranged with respect to each other along a first direction, and
a buried electrode extending through a thickness of the compound semiconductor layer such that an end portion of the buried electrode protrudes into the buffer layer, at least a portion of the buried electrode being arranged on a side of the gate electrode in the first direction opposite to the source, and
a connection member electrically connecting the buried electrode and the source,
wherein a Schottky junction is formed at a lateral sidewall of the buried electrode contacting the compound semiconductor layer.

2. The semiconductor device according to claim 1, wherein a distance from the buried electrode to the drain in the first direction is less than a distance from the drain to the gate electrode in the first direction.

3. The semiconductor device according to claim 1, wherein the drain is arranged between the buried electrode and the gate electrode in the first direction.

4. The semiconductor device according to claim 1, further comprising:
a second transistor with a respective channel formed in the compound semiconductor layer and having a second drain, a second gate electrode, and a second source,
wherein the first transistor and the second transistor are arranged side by side in the first direction, and
the buried electrode is arranged between the drain of the first transistor and the second drain of the second transistor in the first direction.

5. The semiconductor device according to claim 1, wherein at least a portion of the buried electrode is arranged between the drain and the gate electrode in the first direction.

6. The semiconductor device according to claim 5, further comprising:
a gate interconnect formed in a layer above the gate electrode; and
a plurality of contact vias,
wherein the gate electrode extends in a second direction perpendicular to the first direction, and is divided into a plurality of portions,
each contact via connects the gate interconnect to one of the divided gate electrode portions, and
the buried electrode is arranged between a pair of the divided gate electrode portions that are adjacent in the second direction and overlaps with at least a portion of the gate electrode in the first direction.

7. The semiconductor device according to claim 1, wherein the compound semiconductor layer contains Ga and N, the buffer layer comprises a stack of AlN and GaN layers, and
the end portion of the buried electrode protrudes into at least an uppermost AlN layer of the buffer layer.

8. The semiconductor device according to claim 1, wherein a top surface of the buried electrode is at a same height or higher than a top surface of the compound semiconductor layer from the base layer.

9. The semiconductor device according to claim 8, wherein the top surface of the buried electrode is coplanar with a top surface of a drain electrode or a top surface of a gate insulating film of the first transistor.

10. A semiconductor device comprising:
a base substrate layer;
a buffer layer formed over the base substrate layer;
a channel layer formed over the buffer layer;
a transistor with a channel formed in the channel layer and having a source, a gate electrode, and a drain; and
a buried electrode extending through a thickness of the channel layer and having an end disposed within the buffer layer such that only lateral sidewalls of the buried electrode contact the channel layer,
wherein a Schottky junction is formed at one or more of the lateral sidewalls, and
materials of the buffer layer and the buried electrode are selected such that no Schottky junction is formed between the buried electrode and the buffer layer.

11. The semiconductor device according to claim 10, wherein the source, gate electrode, and drain are arranged with respect to each other along a first direction, and the buried electrode is on a side of the gate electrode in the first direction opposite to the source.

12. The semiconductor device according to claim 10, further comprising a barrier layer formed over the channel layer, the buried electrode also extending through a thickness of the barrier layer.

13. The semiconductor device according to claim 12, wherein the barrier layer has a lattice constant different from a lattice constant of the channel layer.

* * * * *